(12) United States Patent
Venkatadri et al.

(10) Patent No.: US 11,056,455 B2
(45) Date of Patent: Jul. 6, 2021

(54) NEGATIVE FILLET FOR MOUNTING AN INTEGRATED DEVICE DIE TO A CARRIER

(71) Applicant: ANALOG DEVICES, INC., Norwood, MA (US)

(72) Inventors: Vikram Venkatadri, Ayer, MA (US); David Frank Bolognia, Charlestown, MA (US)

(73) Assignee: Analog Devices, Inc., Wilmington, MA (US)

( * ) Notice: Subject to any disclaimer, the term of this patent is extended or adjusted under 35 U.S.C. 154(b) by 0 days.

(21) Appl. No.: 16/017,986

(22) Filed: Jun. 25, 2018

(65) Prior Publication Data
US 2019/0043823 A1 Feb. 7, 2019

Related U.S. Application Data

(60) Provisional application No. 62/539,972, filed on Aug. 1, 2017.

(51) Int. Cl.
*H01L 23/00* (2006.01)
*H01L 21/56* (2006.01)
*H01L 27/146* (2006.01)

(52) U.S. Cl.
CPC .......... *H01L 24/32* (2013.01); *H01L 21/563* (2013.01); *H01L 27/14618* (2013.01);
(Continued)

(58) Field of Classification Search
None
See application file for complete search history.

(56) References Cited

U.S. PATENT DOCUMENTS

| 4,883,967 A | 11/1989 | Tsutsui et al. |
| 6,396,898 B1 | 5/2002 | Saito et al. |

(Continued)

FOREIGN PATENT DOCUMENTS

| CN | 101395715 | 3/2009 |
| JP | 2001-338932 A | 12/2001 |

(Continued)

OTHER PUBLICATIONS

Office Action issue in Japanese application No. 2018-143481 dated Sep. 17, 2019.

(Continued)

*Primary Examiner* — Nicholas J Tobergte
*Assistant Examiner* — Kien C Ly
(74) *Attorney, Agent, or Firm* — Knobbe, Martens, Olson & Bear, LLP

(57) ABSTRACT

In some embodiments, an electronic module is disclosed. The electronic module can include a carrier and an integrated device die having an upper surface, a lower surface, and an outer side edge. The integrated device die can include a first surface recessed from the lower surface and a second surface extending between the lower surface and the first surface. The second surface can be laterally inset from the outer side edge. The electronic module can include a mounting compound comprising a first portion disposed between the lower surface of the integrated device die and the carrier and a second portion disposed along at least a portion of the second surface of the integrated device die.

20 Claims, 15 Drawing Sheets

(52) U.S. Cl.
CPC ........ *H01L 27/14636* (2013.01); *H01L 24/13* (2013.01); *H01L 24/16* (2013.01); *H01L 24/48* (2013.01); *H01L 24/73* (2013.01); *H01L 24/92* (2013.01); *H01L 2224/131* (2013.01); *H01L 2224/16227* (2013.01); *H01L 2224/26145* (2013.01); *H01L 2224/32225* (2013.01); *H01L 2224/48091* (2013.01); *H01L 2224/48227* (2013.01); *H01L 2224/73204* (2013.01); *H01L 2224/73265* (2013.01); *H01L 2224/92125* (2013.01); *H01L 2924/10156* (2013.01); *H01L 2924/10157* (2013.01); *H01L 2924/10158* (2013.01)

(56) References Cited

U.S. PATENT DOCUMENTS

| | | |
|---|---|---|
| 6,573,506 B2 | 6/2003 | Sato et al. |
| 6,759,745 B2 | 7/2004 | Masumoto et al. |
| 6,825,572 B2 | 11/2004 | Tian et al. |
| 7,067,817 B2 | 6/2006 | Suganuma et al. |
| 7,122,893 B2 | 10/2006 | Weng et al. |
| 7,358,501 B2 | 4/2008 | Danzer et al. |
| 7,468,514 B1 | 12/2008 | Suzuki et al. |
| 7,504,637 B2 | 3/2009 | Thorne |
| 7,544,947 B2 | 6/2009 | Kerwin et al. |
| 7,691,726 B2 | 4/2010 | Seng |
| 7,812,440 B2 | 10/2010 | Yamazaki et al. |
| 7,892,890 B2 | 2/2011 | Kurosawa et al. |
| 8,350,383 B2 | 1/2013 | Daubenspeck et al. |
| 8,829,454 B2 | 9/2014 | Bolognia |
| 8,866,098 B2 | 10/2014 | Hayatsu et al. |
| 2002/0011572 A1 | 1/2002 | Kajiwara et al. |
| 2003/0010924 A1 | 1/2003 | El-Hanany et al. |
| 2003/0097875 A1 | 5/2003 | Lentz et al. |
| 2003/0111720 A1 | 6/2003 | Tan et al. |
| 2004/0223583 A1 | 11/2004 | Tsujii |
| 2005/0029463 A1 | 2/2005 | Kaemmerer |
| 2005/0051885 A1* | 3/2005 | Weng .................... H01L 21/563 257/687 |
| 2005/0067178 A1 | 3/2005 | Pearson et al. |
| 2005/0285973 A1 | 12/2005 | Singh et al. |
| 2006/0223227 A1 | 10/2006 | Kubota et al. |
| 2007/0221859 A1 | 9/2007 | Nakata |
| 2008/0011959 A1 | 1/2008 | Thorne |
| 2008/0283764 A1 | 11/2008 | Kerwin |
| 2009/0065921 A1 | 3/2009 | Yamazaki et al. |
| 2009/0084971 A1 | 4/2009 | Ohta et al. |
| 2010/0078565 A1 | 4/2010 | Tsubota et al. |
| 2011/0133939 A1 | 6/2011 | Ranganathan et al. |
| 2011/0272588 A1 | 11/2011 | Jadrich et al. |
| 2014/0159226 A1 | 6/2014 | Bolognia |
| 2017/0186719 A1* | 6/2017 | Kira .................... H01L 21/4803 |
| 2018/0102312 A1* | 4/2018 | Pun .................... H01L 21/4853 |
| 2019/0305792 A1* | 10/2019 | Hasegawa .............. H03M 1/56 |

FOREIGN PATENT DOCUMENTS

| | | |
|---|---|---|
| JP | 2002-022841 | 1/2002 |
| JP | 2010-021251 A | 1/2010 |
| JP | 2010-034519 A | 2/2010 |
| JP | 2010-278220 A | 12/2010 |
| JP | 2014-011665 A | 1/2014 |
| JP | 2014-035293 A | 2/2014 |
| JP | 2014-056954 A | 3/2014 |
| JP | 2017-120800 A | 7/2017 |
| JP | 06-260723 | 1/2018 |
| WO | WO 2007/102358 A1 | 7/2009 |

OTHER PUBLICATIONS

Cesmeli, "V-ResTM—Detecting the Difference in Volume CT," GE Healthcare Publication, 2 pages.

Huai-Hui et al., "Fracture analysis on die attach adhesives for stacked packages based on in-situ testing and cohesive zone model", Microelectronics Reliability, 53:1021-1028 (Jul. 2013).

Maloney, "Close Cooperation Among a Global Engineering Team Led to the Success of the Lightspeed VCT Medical Scanner," Test & Measurement World, Aug. 2005, 5 pages.

Yang, "Underfill viscous flow between parallel plates and solder bump", IEEE Transactions on Components and Packaging Technologies, 25(4):695-700 (Dec. 2002).

Zhang et al., "Recent Advances in Flip-Chip Underfill: Materials, Process, and Reliability", IEEE Transactions on Advanced Packaging, 27(3):515-524 (Aug. 2004).

* cited by examiner

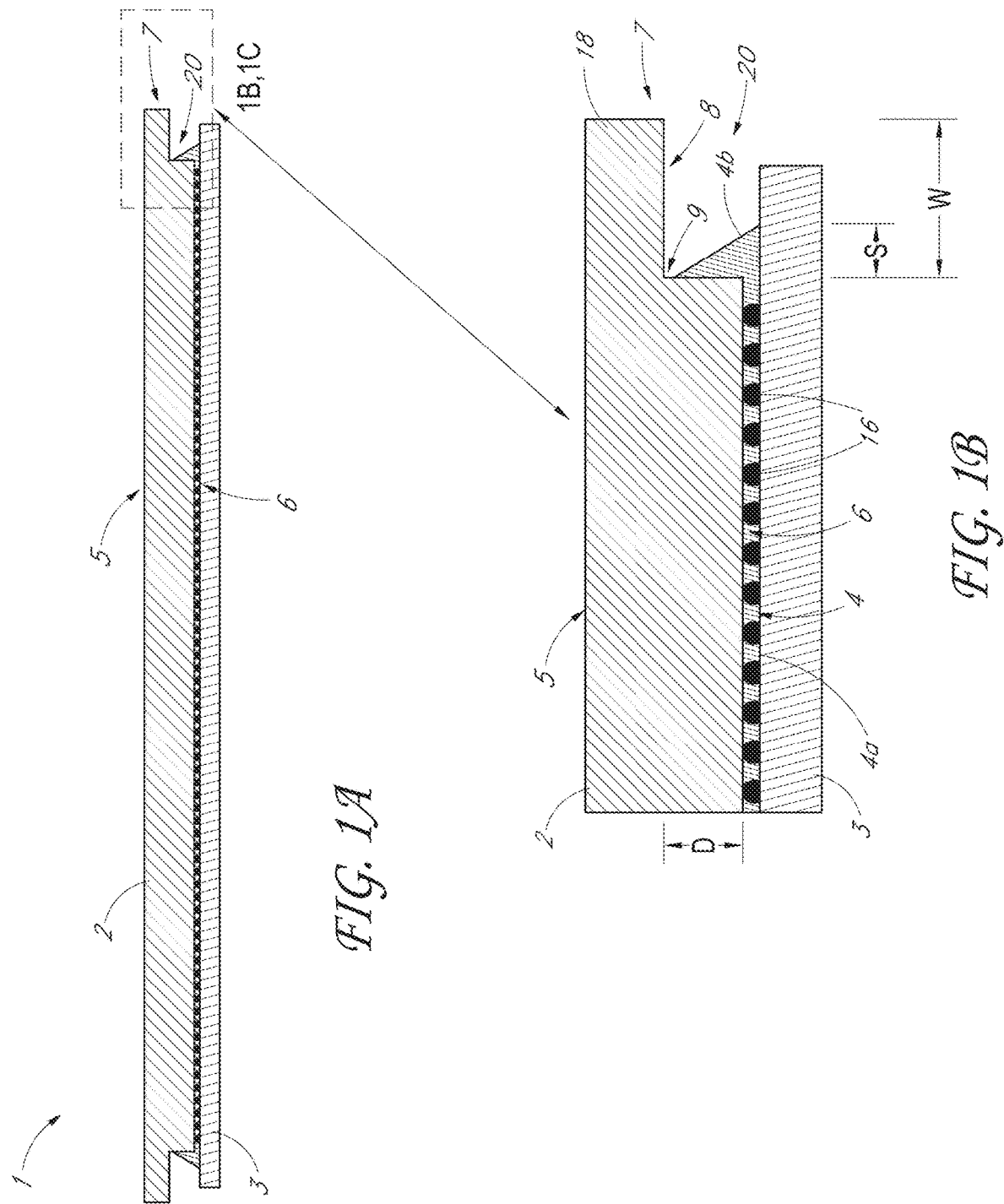

MOUNTING INTEGRATED DEVICE TO A CARRIER WITH A MOUNTING COMPOUND HAVING A FIRST PORTION DISPOSED BETWEEN A LOWER SURFACE OF THE INTEGRATED DEVICE DIE AND THE CARRIER AND A SECOND PORTION DISPOSED ALONG AT LEAST A PORTION OF A SECOND SURFACE OF THE INTEGRATED DEVICE DIE

FIG. 9

NEGATIVE FILLET FOR MOUNTING AN INTEGRATED DEVICE DIE TO A CARRIER

CROSS-REFERENCE TO RELATED APPLICATIONS

This application claims the benefit of U.S. Provisional Patent Application No. 62/539,972 entitled "NEGATIVE FILLET FOR MOUNTING AN INTEGRATED DEVICE DIE TO A CARRIER," filed Aug. 1, 2017, the entire disclosure of which is incorporated herein by reference for all purposes. This application is related to U.S. patent application Ser. No. 13/405,594 (now U.S. Pat. No. 8,829,454), filed Feb. 27, 2012; U.S. patent application Ser. No. 14/478,810 (now U.S. Pat. No. 9,466,594), filed Sep. 5, 2014; U.S. patent application Ser. No. 13/708,727 (now U.S. Pat. No. 9,116,022), filed Dec. 7, 2012; and U.S. patent application Ser. No. 14/805,835, filed Jul. 22, 2015, the contents of each of which are incorporated by reference herein in their entirety and for all purposes.

BACKGROUND

Field

The present disclosure relates generally to methods and structures for mounting an integrated device die to a carrier, and in particular, to methods and structures that can confine a mounting compound (e.g., underfill, die attach adhesive, etc.) to remain under the die.

Description of the Related Art

Integrated device dies can be mounted to a carrier, such as a package substrate, another integrated device die, an interposer, etc., using compounds that are typically applied in fluid form between the die and the carrier and subsequently hardened or cured. For example, in some integrated device packages, the integrated device die can be flip chip mounted to the carrier by way of solder balls that connect contact pads of a lower surface of the integrated device die to corresponding contact pads of the carrier. An underfill epoxy can be provided between around the solder balls between the integrated device die and the carrier. In other examples, an adhesive is provided between the die and the carrier, such as anisotropic conductive film (ACF) on the backside of the die or conventional die attach adhesives on the front or active side of the die. Often, the compound (e.g., adhesive or underfill epoxy) may extend past the lateral side edges of the integrated device die, which may be undesirable in various applications, e.g., in arrangements in which the die is to be spaced laterally in close proximity to another device or die. Accordingly, there remains a continuing need for improved techniques for mounting an integrated device die to a carrier with an adhesive.

SUMMARY

In one aspect, an electronic module is disclosed. The electronic module can comprise a carrier and an integrated device die having an upper surface, a lower surface, and an outer side edge. The integrated device die can comprise a first surface recessed from the lower surface and a second surface extending between the lower surface and the first surface, the second surface laterally inset from the outer side edge. The electronic module can comprise a mounting compound comprising a first portion disposed between the lower surface of the integrated device die and the carrier and a second portion disposed along at least a portion of the second surface of the integrated device die.

In one aspect, an electronic module is disclosed. The electronic module can comprise a carrier and an integrated device die having an upper surface, a lower surface, and an outer side edge. The integrated device die can comprise a first surface recessed from the lower surface and a second surface extending between the lower surface and the first surface, the second surface laterally inset from the outer side edge. The electronic module can comprise a mounting compound comprising a first portion disposed between the lower surface of the integrated device die and the carrier. The mounting compound may not contact the outer side edge of the integrated device die in various embodiments.

In one aspect, a method for assembling an electronic module is disclosed. The method can comprise mounting an integrated device to a carrier with a mounting compound. The integrated device die can have an upper surface, a lower surface, and an outer side edge. The integrated device die can comprise a first surface recessed from the lower surface and a second surface extending between the lower surface and the first surface, the second surface laterally inset from the outer side edge. The mounting compound can comprise a first portion disposed between the lower surface of the integrated device die and the carrier and a second portion disposed along at least a portion of the second surface of the integrated device die.

In one aspect, an electronic module is disclosed. The electronic module includes a package substrate and an integrated die. The integrated device die has an upper side, a lower side, and an outer side edge. The lower side comprises a first portion and a recess at or near the outer side edge. The integrated device die is at least as wide as the package substrate laterally. The electronic module also includes a mounting compound that comprises a first portion and a second portion. The first portion of the mounting compound is disposed between the first portion of the integrated device die and the package substrate and the second portion of the mounting compound is disposed along at least a portion of the recess of the integrated device die.

In one embodiment, the electronic module further includes a plurality of electrical interconnects that electrically connect first contact pads on the first portion of the integrated device die with corresponding second contact pads on the package substrate. The mounting compound comprising an underfill material disposed around the plurality of electrical interconnects.

In one embodiment, the electronic module further includes active circuitry at or near the lower side of the integrated device die.

In one embodiment, the electronic module further includes active circuitry at or near the upper side of the integrated device die.

In one embodiment, the mounting compound is laterally inset relative to the outer side edge of the integrated device die.

In one embodiment, the mounting compound comprises a concave surface.

In one embodiment, the package substrate comprises a flexible substrate that has a nonconductive material with embedded metal traces. The electronic module can further comprise a stiffener. The flexible substrate can be wrapped around a portion of the stiffener.

In one embodiment, the integrated device die comprises a sensor die.

In one embodiment, the recess is laterally inset from the outer side edge in a range of 100 microns to 500 microns.

In one embodiment, the recess comprises a sloped wall extending between the first portion and the outer side edge.

In one embodiment, the recess comprises a groove that has a first wall extending vertically from the first portion towards the upper surface and a second wall. The first and second walls are disposed on opposing sides of the groove.

In one aspect, an electronic module is disclosed. The electronic module comprises a package substrate and an integrated device die. The integrated device die has an upper surface, a lower surface, and an outer side edge. The lower surface comprised a mounting surface and a groove that is inset from the outer side edge. The electronic module also includes a mounting compound that is disposed between the mounting surface of the integrated device die and the package substrate.

In one embodiment, a portion of the mounting compound is disposed in the groove of the integrated device die.

In one embodiment, the integrated device comprises a first portion that has a first average thickness, a second portion that has a second average thickness thinner than the first average thickness, and a third portion that is hanging from the second portion. The groove is formed between the first portion and the third portion.

In one embodiment, groove partially surrounds the mounting surface of the lower surface.

In one embodiment, the electronic module further includes a conductive wire electrically connecting a first contact pad on the upper surface of the integrated device die with a second contact pad on the package substrate.

In one embodiment, the electronic module further includes a plurality of solder balls that electrically connects first contact pads on the lower surface of the integrated device die with corresponding second contact pads on the package substrate. The mounting compound comprises an underfill material disposed around the plurality of solder balls.

In one embodiment, the electronic module further includes active circuitry at or near the lower surface of the integrated device die.

In one embodiment, the mounting compound is laterally inset relative to the outer side edge of the integrated device die.

In one aspect, a method for assembling an electronic module is disclosed. The method includes mounting an integrated device to a carrier with a mounting compound. The integrated device die has an upper surface, a lower surface, and an outer side edge. The integrated device die comprises a first surface recessed from the lower surface and a second surface extending between the lower surface and the first surface. The second surface laterally inset from the outer side edge. The outer side edge defines an outer most edge of the electronic module. The method also includes the mounting compound that comprises a first portion disposed between the lower surface of the integrated device die and the carrier and a second portion that is disposed along at least a portion of the second surface of the integrated device die.

In one embodiment, the carrier comprises a flexible substrate. The method further includes attaching the flexible substrate to a stiffener after the mounting and wrapping the flexible substrate about a portion of the stiffener.

In one embodiment, the method further comprises partially sawing through a back side of a wafer to define the first and second surfaces.

In one embodiment, the mounting compound comprises an underfill epoxy. The method can further comprise electrically connecting first contact pads on the lower surface of the integrated device die with corresponding second contact pads on the carrier by way of a plurality of solder balls. The method can further comprise providing the underfill epoxy around the plurality of solder balls.

In one aspect, an electronic module comprising is disclosed. The electronic module includes a means for mounting an integrated device die on a package substrate. The integrated device die has an upper side, a lower side, and an outer side edge. The lower side comprises a first portion and a means for receiving the means for mounting at or near the outer side edge. The integrated device die is at least as wide as the package substrate laterally. The means for mounting comprises a first portion that is disposed between the first portion of the integrated device die and the package substrate and a second portion disposed along at least a portion of the means for receiving the means for mounting.

In one embodiment, the means for mounting comprises an underfill material and the means for receiving the means for mounting comprises a recess. The recess prevents the mounting means from moving to the upper side of the integrated device die.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

Specific implementations of the invention will now be described with reference to the following drawings, which are provided by way of example, and not limitation.

FIG. 1A is a schematic side view of an electronic module comprising an integrated device die mounted to a carrier, according to various embodiments.

FIG. 1B is an enlarged schematic side view of an end region of the electronic module of FIG. 1A.

FIG. 9 is a flowchart illustrating a method for assembling an electronic module, according to another embodiment.

DETAILED DESCRIPTION

Figure 1C:
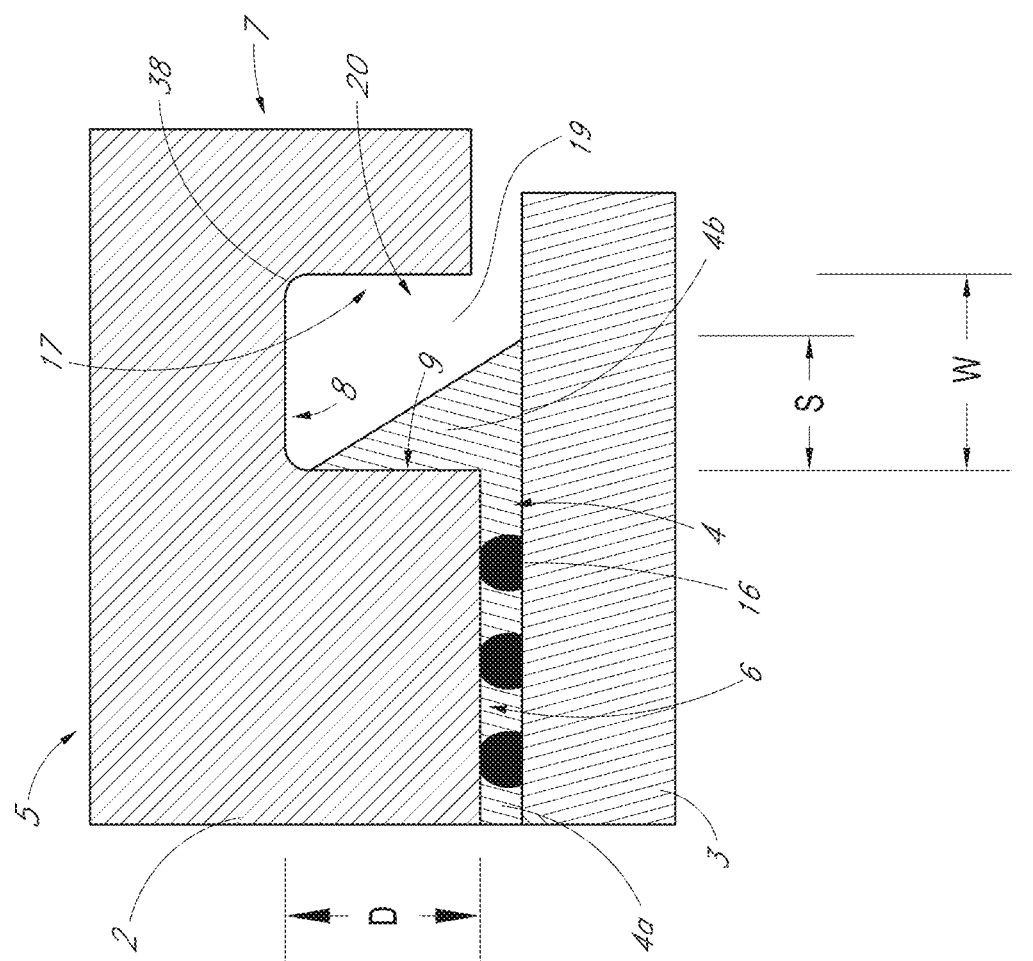
FIG. 1C is an enlarged schematic side view of an end region of an electronic module, according to another embodiment.

Various embodiments disclosed herein relate to an electronic module comprising an integrated device die mounted to a carrier. The integrated device die can be mounted to the carrier with a compound such as underfill or adhesive between the integrated device die and the carrier. In some electronic modules, the compound may extend laterally outward past an outer side edge of the integrated device die. In such arrangements, the outwardly extending adhesive may interfere with adjacent components. If the compound extends beyond the outer side edge of the integrated device die, the compound may occupy excessive real estate or interfere with adjacent features of the module. Often the compound is organic, such as plastic or epoxy materials, which is applied in fluid form and subsequently cured or otherwise hardened.

Thus, in various embodiments disclosed herein, an electronic module can comprise a carrier and an integrated device die having an upper surface, a lower surface, and an outer side edge. The integrated device die can comprise a recess. The integrated device die can comprise a first surface recessed from the lower surface and a second surface extending between the lower surface and the first surface. The second surface can be laterally inset from the outer side edge. The electronic module can comprise a compound comprising a first portion disposed between the lower surface of the integrated device die and the carrier. The compound can comprise a second portion disposed along at least a portion of the second surface of the integrated device die or at least a portion of the recess. Beneficially, the compound may be laterally inset relative to the outer side edge of the integrated device die, such that the adhesive does not interfere with adjacent components.

FIG. 1A is a schematic side view of an electronic module 1 comprising an integrated device die 2 mounted to a carrier 3, according to various embodiments. FIG. 1B is an enlarged schematic side view of an end region of the electronic module 1 of FIG. 1A. In various embodiments, the electronic module 1 can comprise a sensor module or any other type of electronic device. In some embodiments, the electronic module 1 can comprise an integrated device package. The carrier 3 of FIGS. 1A-1B can comprise any suitable carrier. For example, in some embodiments, the carrier 3 can comprise a package substrate, such as a flexible substrate including a nonconductive material and a plurality of embedded metal traces, a printed circuit board (PCB), a leadframe substrate, a ceramic substrate, etc. In other embodiments, the carrier 3 can comprise another integrated device die, an interposer, or any other suitable type of carrier. The integrated device die can comprise any suitable type of integrated device die, including, e.g., a sensor die, a processor die, a memory die, a microelectromechanical systems (MEMS) die, etc. As shown in FIG. 1A, in some embodiments, a footprint of the carrier 3 may be smaller than a footprint of the die 2. For example, the integrated device die 2 may be larger than or at least as wide as (e.g., as wide as, or wider than) the carrier 3 laterally, in some embodiments. In some embodiments, such relative dimensions may help two or more modules 1 to be placed next to one another more accurately than a module with the carrier 3 that is larger than the die 2.

The integrated device die 2 can comprise an upper surface 5 and a lower surface 6 opposite the upper surface 5. The upper surface 5 can be a surface on an upper side of the integrated device die 2 and the lower surface 6 can be a surface on a lower side of the integrated device die 2. In some embodiments, active components (e.g., active circuitry) can be provided at or near the lower surface 6 of the die 2. The integrated device die 2 can comprise one or a plurality of outer side edges 7 that define an outer periphery of the die 2. As shown in FIG. 1B, the integrated device die 2 can be mounted to the carrier 3 at least in part by a compound 4. In the illustrated embodiment, for example, a plurality of solder balls 16 can electrically connect first contact pads (not shown) on the lower surface 6 of the integrated device die 2 with corresponding second contact pads (not shown) on the carrier 3. In such embodiments, the compound 4 can comprise an underfill material (e.g., an underfill epoxy) disposed around the plurality of solder balls 16. Thus, the compound 4 can be applied in fluid form, flowed around the solder balls 16 or interconnects to protect and enhance the reliability of the electrical connections between the die 2 and the carrier 3, and/or to improve thermal matching between the die 2 and the carrier 3. In other embodiments, the compound 4 can comprise a die attach material that is not used as underfill for solder ball connections. For example, the compound 4 can comprise a conventional die attach adhesive applied to the back side of the die 2 and the die 2 can be electrically connected in other ways, such as by bonding wires. In another example, the compound 4 can comprise anisotropic conductive film (ACF) or nonconductive paste (NCP) applied to the front side of the die 2 to serve electrical, adhesive and/or protective sealing functions.

As shown in FIG. 1B, the integrated device die 2 can further comprise a first surface 8 recessed from the lower surface 6 and a second surface 9 extending between the lower surface 6 and the first surface 8, with the second surface 9 laterally inset from the outer side edge 7 of the die 2. The first surface 6 and the second surface 8 may collectively define at least a portion of a recess 20 formed on the lower side of the die 2. The recess 20 may comprise any shape. The compound 4 can comprise a first portion 4a disposed between the lower surface 6 of the integrated device die 2 and the carrier 3 and a second portion 4b disposed along at least a portion of the second surface 9 of the integrated device die 2. When applied in fluid form before hardening or curing, capillary action can help draw the compound 4 around the solder balls 16 (or other interconnects) and can pull the compound 4 out from between the lower surface 6 and the carrier 3, such that the second portion 4b of the compound 4 may contact a portion of the second surface 9 between the first surface 8 and the carrier 3 or be disposed in at least a portion of the recess 20. In some embodiments, the second portion 4b may also contact the first surface 8. As shown in FIG. 1B, the first and second portions 4a, 4b of the compound 4 may comprise a continuous material. Moreover, as shown in FIG. 1B, the compound 4 (e.g., both the first and second portions 4a, 4b) may be laterally inset relative to the outer side edge 7 of the die 2. In some embodiments, the second portion 4b of the compound may extend inwardly at an angle from the carrier 3 to the die 2, as shown in FIG. 1B. In some embodiments, the second portion 4a can comprise a concave or convex surface. Beneficially, providing the negative fillet so that it is within the outline of the outer side edge 7 of the die 2 can enable the outer side edge 7 of the die 2 to abut and/or be closely spaced relative to an adjacent component, such as another integrated device die.

As shown in FIG. 1B, a depth D of the first surface 8 relative to the lower surface 6 can be selected to be sufficiently large so as to accommodate the negative fillet associated with the second portion 4b of the compound, but sufficiently small so as to avoid weakening the die. In some embodiments, the depth D can be in a range of 100 microns to 300 microns, or in a range of 100 microns to 250 microns for a 500 micron thick die, e.g., in a range of 100 microns to 120 microns. In some embodiments, the depth D can be in a range of 20% to 50% of the thickness of the die 2, e.g., in a range of 20% to 30% of the thickness. The second portion 4b of the mounting compound 4 can have a fillet distance S extending outside the second surface 9. The second surface 9 can be provided inset from the outer side edge 7 by a width W of an overhang region 18 of the die 2, as measured from the outer side edge 7 of the die. In some embodiments, the width W of the overhang region 18 can be in a range of 100 microns to 500 microns. The overhang region 18 (and the first and second surfaces 8, 9) can be defined in any suitable manner. For example, in some embodiments, the overhang region 18 can be defined by providing a step cut (e.g., a saw cut) through a portion of the thickness of the die 2, e.g., by partially sawing through the lower surface 6. In other embodiments, the overhang region 18 can be defined by etching, laser cutting or drilling, or any other suitable method. Therefore, in some embodiments, a relative angle between the first and second surfaces may not be 90 degrees as illustrated in FIGS. 1A and 1B. Also, the first and second surfaces may not be flat as illustrated in FIGS. 1A and 1B.

FIG. 1C is an enlarged schematic side view of an end region of an electronic module 1, according to another embodiment. Unless otherwise noted, components shown in FIG. 1C may be the same as or generally similar to like numbered components in FIGS. 1A and 1B. As with the embodiment of FIGS. 1A and 1B, the die 2 can be mounted to the carrier 3. The die 2 can comprise an upper surface 5, a lower surface 6, a first surface 8 recessed relative to the lower surface 6, and a second surface 9 extending between the first surface 8 and the lower surface 6. A first portion 4a of the compound 4 can be disposed around solder balls 16 between the lower surface 6 of the die 2 and the carrier 3. A second portion 4b (e.g., a negative fillet) of the compound 4 can be provided along at least a portion of the second surface 9 and can be laterally inset relative to the outer side edge 7 of the die 2.

However, unlike the embodiment shown in FIG. 1B, a recess 20 of the die 2 can comprise a groove 19 defined partially through the lower surface of the die 2. The groove 19 can define the first and second surfaces 8, 9, as well as a third surface 17. The second and third surfaces 9, 17 can be disposed on opposing sides of the groove 19. The third surface 17 can extend between the first surface 8 and the lower surface 6. The groove 19 may beneficially reduce chipping and/or increase strength as compared with the step cut shown in FIG. 1B. As with FIG. 1A-1B, the groove 19 may be formed by sawing, etching, laser cutting or drilling, or any other suitable method.

Moreover, the groove 19 can have a width W and a depth D defined to accommodate the second portion 4b of the adhesive 4. In some embodiments the depth D can be in a range of 100 microns to 300 microns, or in a range of 100 microns to 250 microns for a 500 micron thick die, e.g., in a range of 100 microns to 120 microns. In some embodiments, the depth D can be in a range of 20% to 50% of the thickness of the die 2, e.g., in a range of 20% to 30% of the thickness. A width W of the groove 19 may be greater than a fillet distance S representative of the width of the second portion 4b of adhesive 4. In some embodiments, the width W of the groove 19 can be in a range of 100 microns to 500 microns. Further as shown in FIG. 1C, the groove 19 can comprise fillets 38 at the corner regions of the groove 19. It should be understand that, in some embodiments, the fillet 38 can be disposed only at one of the corner regions. The fillet 38 along the corner region of the groove 19 can improve die strength and have a sufficient radius so as to enhance die chipout strength. In various embodiments, a radius of the fillets 38 can be in a range of 2 mm to 4 mm. Further, although the fillets 38 are shown in conjunction with the groove 19, it should be appreciated that the fillets 38 may also be formed in the step cut embodiment shown in FIGS. 1A-1B.

Figure 1D:
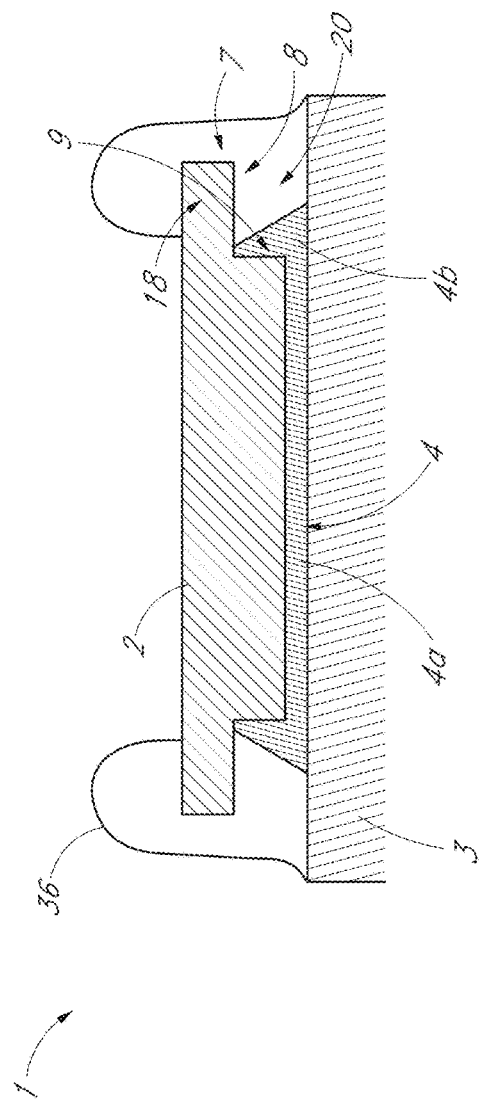
FIG. 1D is a schematic side view of an electronic module with the integrated device die being wire bonded to the carrier by way of bonding wires.

FIG. 1D is a schematic side view of an electronic module 1 with the integrated device die 2 being wire bonded to the carrier 3 by way of bonding wires 36. The electronic module 1 of FIG. 1D is generally similar to the electronic module 1 of FIG. 1B, except in FIG. 1D, the die 2 is wire bonded to the carrier with the bonding wires 36. In the embodiment of FIG. 1D, the mounting compound 4 can comprise a die attach adhesive to attach the die 2 to the carrier 3. As with the embodiment illustrated in FIG. 1B, the die 2 can comprise a recess 20. Beneficially, the overhang region 18 of the die 2 can mitigate and/or prevent the compound 4 from getting, reaching or moving on the top surface of the die 2.

Figure 1E:
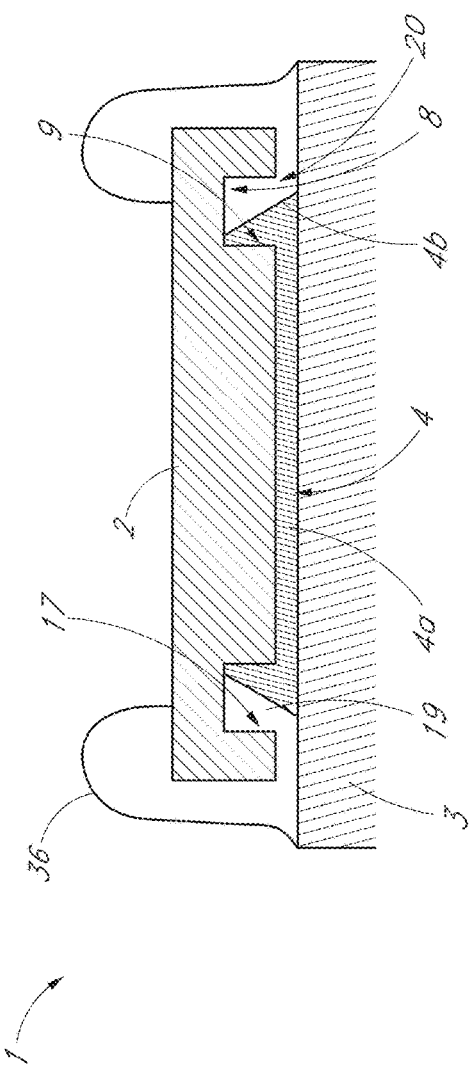
FIG. 1E is a schematic side view of an electronic module with the integrated device die being wire bonded to the carrier by way of bonding wires.

FIG. 1E is a schematic side view of an electronic module 1 with the integrated device die 2 being wire bonded to the carrier 3 by way of bonding wires 36. The electronic module 1 of FIG. 1E is generally similar to the electronic module 1 of FIG. 1C, except in FIG. 1E, the die 2 is wire bonded to the carrier with the bonding wires 36. In the embodiment of FIG. 1E, the mounting compound 4 can comprise a die attach adhesive to attach the die 2 to the carrier 3. Beneficially, the groove 19 of the die 2 can mitigate and/or prevent the compound 4 from getting, reaching or moving on the top surface of the die 2.

Figure 2:
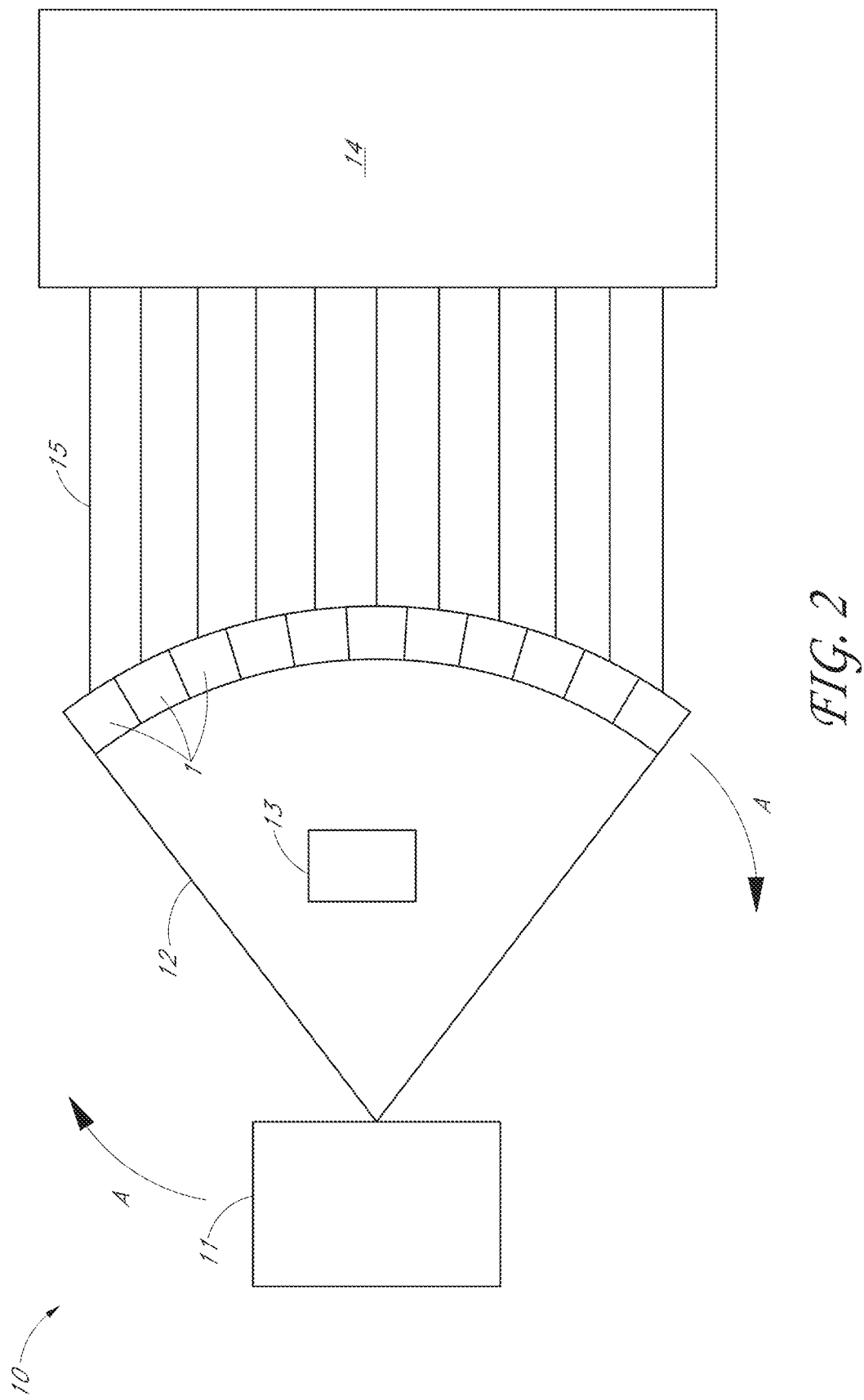
FIG. 2 is a schematic plan view of an imaging system, according to one embodiment.

Examples of Electronic Modules with a Negative Fillet Adhesive for Mounting a Die to a Carrier The negative fillet adhesives disclosed herein can be used with any type of electronic module. FIG. 2 illustrates an imaging system 10 according to one embodiment that utilizes such negative fillet adhesives. In some implementations, the imaging system 10 can be a computed tomography (CT) device. CT devices are useful in a variety of fields, including medical imaging, industrial imaging, nondestructive testing, and subsurface imaging. In the imaging system 10 of FIG. 2, a source 11 can emit radiation 12 in the direction of an object 13 to be imaged (e.g., a patient). In one embodiment, the source 11 emits x-ray radiation. Skilled artisans will understand that there are various conventional mechanisms to emit radiation for imaging purposes. After some portion of the radiation 12 passes through the object 13, it reaches a one-dimensional (1D) or two-dimensional (2D) array of electronic modules 101 (e.g., sensor modules) positioned opposite the source 11. The electronic modules 101 can be configured to convert detected radiation (e.g., visible light) to electrical signals using a photodiode array (PDA), which can be the sensor of this imaging example. In some implementations, the electronic module 101 may also be configured to convert detected x-ray radiation to visible light, or the system 10 can include a separate scintillator for that purpose. In other implementations, detected x-ray radiation may be converted to electrical signals in other ways. The electronic module 101 is also configured to convert the analog signals received from the PDA into digital signals that can be transmitted by transmission elements 15 to an external control module 14. The electronic module 101 can also perform various other preprocessing and/or preconditioning operations on the detected signals before transmission to the control module 14. After the processed digital signals are received by the control module 14, the control module 14 can further process the digital signals into a readable output, such as an image on a display device or a report of various measured values calculated from the received signals. To obtain a full 3D image of the object 13, the system 10 can rotate around the object 13 in the direction A shown in FIG. 2 to obtain images of the subject 13 at various angles.

In other embodiments, the imaging system can be an ultrasound device. Although an ultrasound device is not expressly illustrated herein, it should be appreciated that an ultrasound device, according to some embodiments, can include a source of ultrasonic waves and a detector (or detector array) that includes one or more electronic modules similar to those described in more detail below. Furthermore, the electronic module(s) can be used in nuclear imaging implementations, such as PET scans and gamma ray imaging techniques. In yet other embodiments, the electronic modules can be used in various non-imaging arrangements, e.g., electrical, electronic, or optical applications that employ a compact module that includes both a sensor and a processor. For example, microelectromechanical systems (MEMS) devices, such as MEMS microphones and accelerometers, may include both a sensor die and a processor die near the sensor in order to process signals from the sensor. In these embodiments, electronic modules similar to those illustrated herein may be useful in providing a compact sensor package, while thermally insulating the sensor from the processor.

Figure 3:
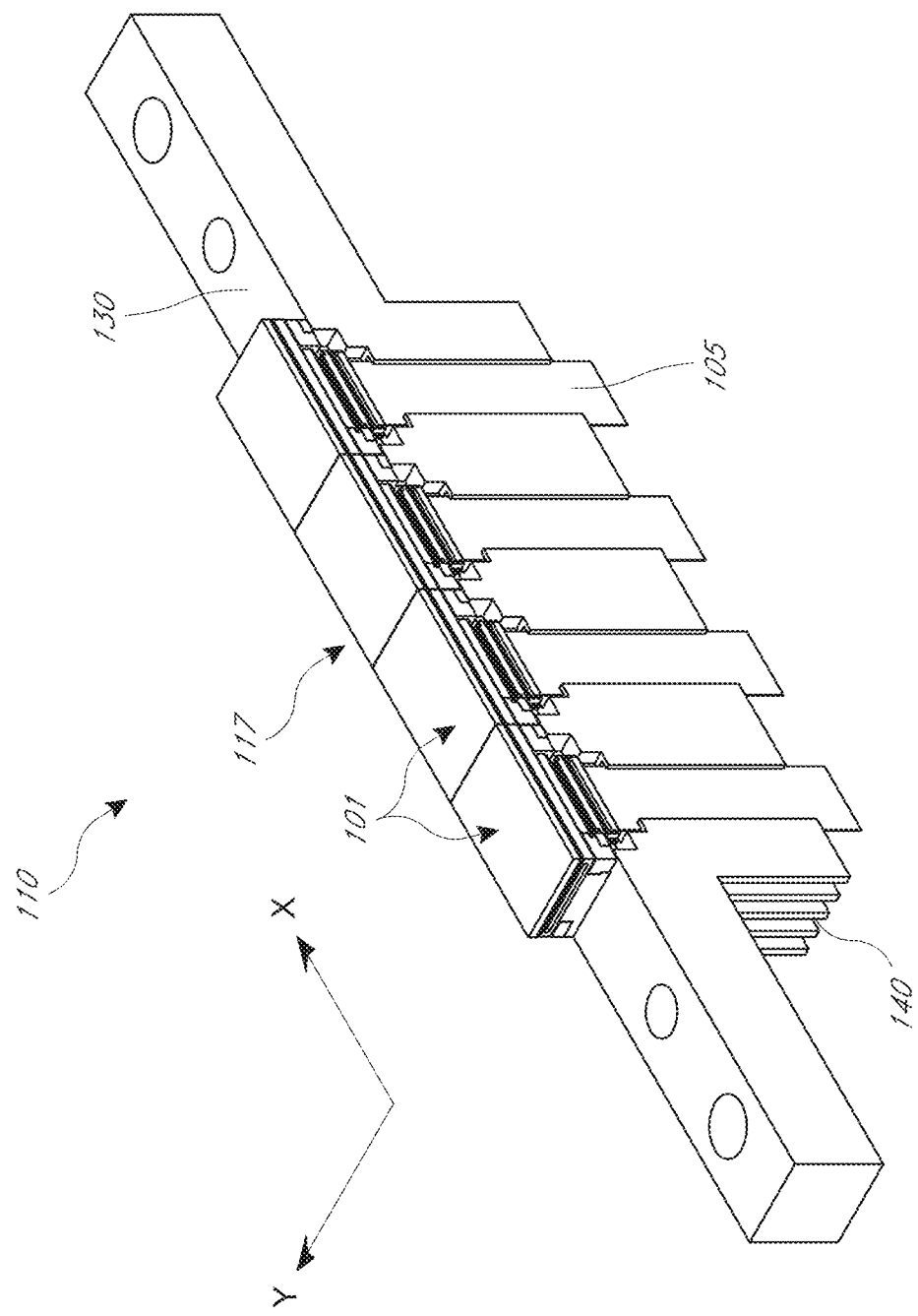
FIG. 3 is a three-dimensional schematic perspective view of a portion of an array of electronic modules, in accordance with an embodiment.

FIG. 3 is a three-dimensional schematic perspective view of a portion of an array of electronic modules 101. As shown in FIG. 3, each electronic module 101 can be mounted on a bracket 130 that is part of a larger imaging system 110. The imaging system 110 may be the same as or similar to the imaging system 10 described above with respect to FIG. 2. For example, the imaging system may comprise a CT device, an X-ray device, an ultrasound device, etc. In the example of FIG. 3, four electronic modules 101 (e.g., four sensor modules) are positioned in a string 117 that extends along a longitudinal X-axis, however, it should be appreciated that more or fewer than four modules 101 can be positioned in the string 117 adjacent one another along the X-axis. Although not illustrated in FIG. 3, the array of modules 101 can comprise multiple strings 117 adjacent one another along a direction which is transverse to the X-axis. In some embodiments, the strings 117 can be positioned along a curved surface, each string 117 representing one of the modules 1 of FIG. 2. As shown in FIG. 3, for example, the Y-axis of the illustrated string 117 can be tangent to the curved surface along which the array of modules 101 is positioned. In various arrangements, a patient can be positioned inside the curved surface of the array, and the system 110 can image portions of the patient's body.

As shown in FIG. 3, the electronic modules 101 can be mounted on a front side of the bracket 130 and one or more heat sinks 140 can be disposed on a back side of the bracket 130. Each heat sink 140 can comprise fins or other heat transfer elements that can effectively dissipate heat generated by the modules 101 into the atmosphere. In some embodiments, a fan can direct air over the heat sink 140 to improve heat dissipation from the modules 101; in other embodiments, the heat sink 140 can be exposed to ambient air without the use of a fan. In addition, as shown in FIG. 3, a connector substrate 105 can extend downwardly from each module 101 to connect to an external control module, which may be the same as or similar to the control module 14 described above in connection with FIG. 2. Furthermore, as shown in FIG. 3, it can be important to space adjacent modules 101 apart along the bracket 130 by a small gap so that adjacent modules 101 do not touch one another.

Figure 4:
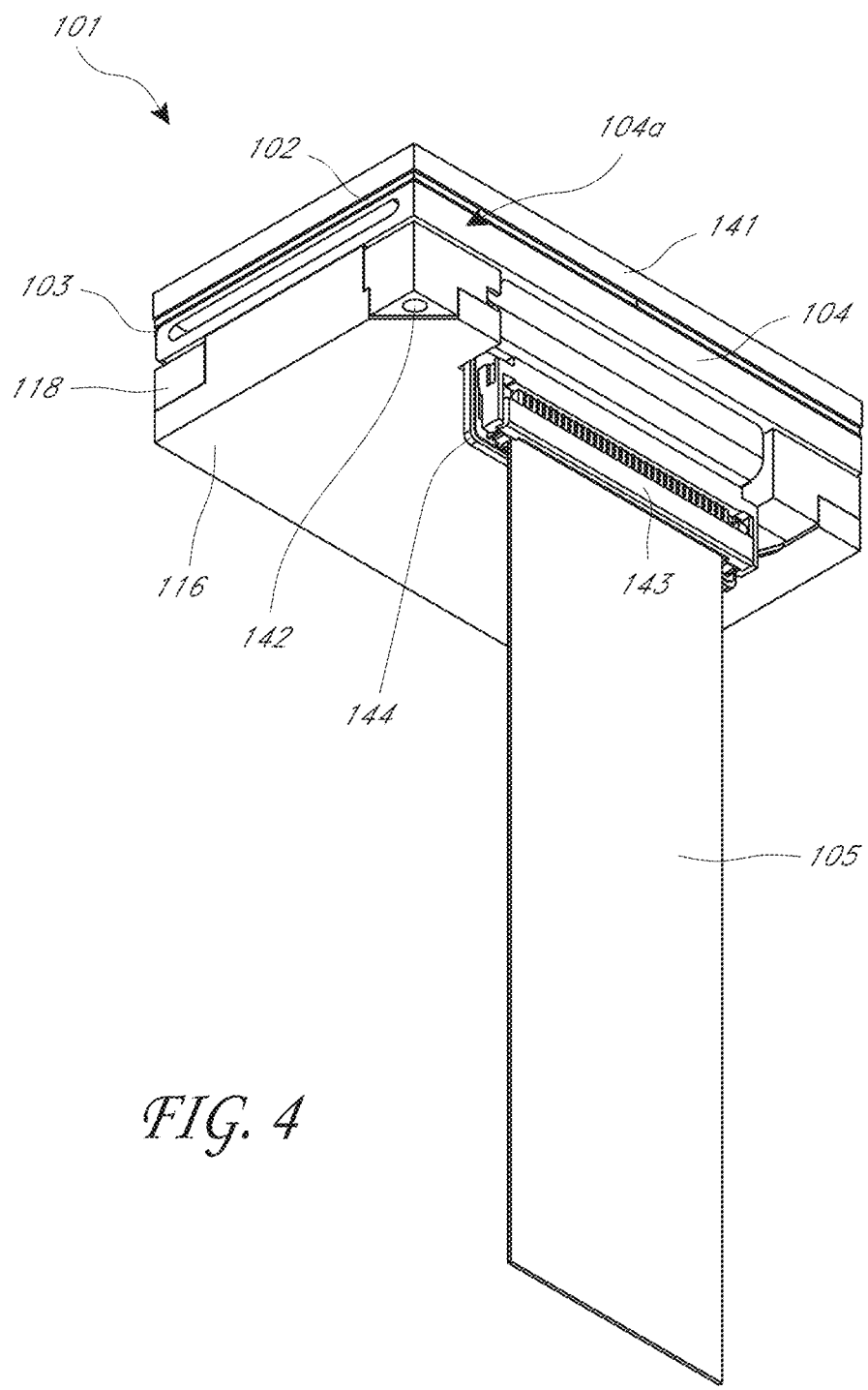
FIG. 4 is a three-dimensional schematic top perspective view of one the electronic modules shown in FIG. 3.

FIG. 4 is a three-dimensional schematic top perspective view of the electronic module 101 shown in FIG. 3. The electronic module 101 can include one or more sensor dies 102 mounted on a flexible sensor substrate 103. Thus, in FIG. 4, the sensor substrate 103 can act as the carrier 3 shown in FIGS. 1A-1C. While referred to for convenience as a "flexible" substrate 103, it will be understood that in the course of assembly, including adhesion of the substrate 103 to other parts, the substrate may be rendered inflexible. The sensor substrate 103 can be a flexible substrate with integrated bond pads, leads and traces, which allows for a low profile. The sensor substrate 103 can include multiple conductive leads configured to electrically couple to external devices or substrates. In some embodiments, the sensor die 102 can be mechanically and electrically coupled to the sensor substrate 103 by way of a gold thermocompression bond with copper leads. In other embodiments, the sensor die 102 can be soldered to the sensor substrate 103, while in yet other embodiments, the sensor die 102 can be coupled to the sensor substrate 103 using anisotropic conductive film (ACF) or non-conductive paste (NCP) technologies.

Flexible substrates can be useful in arrangements where it is desirable for the substrate to conform to a particular geometry employed within a system. Flexible substrates can be made of a flexible plastic material, such as polyimide or PEEK and can include integrated bond pads, traces and leads similar to those used in conventional PCB substrate technologies. The flexible substrate can be easily bent or folded to conform to a particular geometry, which permits contacting downstream components in a variety of configurations. Furthermore, traces and leads can be patterned on the flexible substrate in very small dimensions. For example, in some embodiments, the traces can have line widths and spaces on the order of about 15 to 20 µm, and the leads or bond pads can have widths or diameters of about 200-300 µm with similar spacing, such that the pitch is on the order of 400-600 µm. By employing small lead pitch, it is possible for the sensor substrate to electrically communicate with a large number of pixels (e.g., corresponding to portions of the PDA), which can advantageously increase the resolution of the imaging device. In one embodiment, each of the four illustrated sensor dies 102 can include 480 pixels electrically coupled to the sensor substrate 103, for a total of 1920 pixels in the 4-sensor array shown in FIG. 3. In other embodiments, each sensor die can include a fewer or a greater number of pixels, including e.g., 512 pixels per sensor die. In yet other embodiments, the line widths and spaces can be much smaller or larger, depending on the desired lead density for a particular arrangement. The dimensions of the electronic module 1 can vary according to the desired implementation. For example, in some embodiments, the illustrated four-die electronic module can have a total length in a range of about 60 mm to about 100 mm and a width in a range of about 20 mm to about 30 mm. The height or thickness of the electronic module 1 can be relatively small, e.g., in a range of about 5 mm to about 10 mm in various embodiments.

In some embodiments, the sensor die 102 can comprise an x-ray sensing device, including, e.g., a photodiode array (PDA) or other imaging sensor. As shown in FIG. 4, in x-ray applications, the module 101 may also include a collimator (not shown) and a scintillator 141 for converting the x-rays to visible light. The converted visible light can then be received by the sensor die 102, which can convert the visible light to an electrical signal. Alternatively, the collimator and scintillator can be separately provided over the module within the imaging system. In still other embodiments, the sensor die can include any other suitable device configured to detect signals, including, e.g., MEMS sensors and other electrical and electronic sensors. In the embodiment of FIG. 4, the electronic module 101 includes two sensor dies 102, but in other embodiments, it is possible to only use one, three, four, or greater than four sensor dies.

Returning to FIG. 4, the sensor substrate 103 can be mounted on or coupled to a portion of a stiffener 104. The stiffener 104 can provide structural support for the electronic module 101 and can assist in thermally separating the sensor dies 102 from the processor dies, as described in U.S. patent application Ser. No. 14/805,835, which is incorporated by reference herein. As discussed in more detail below, the sensor substrate 103 can be wrapped around the stiffener 104. For example, a bottom segment of the sensor substrate 103 can be folded or wrapped around a first lateral side 104a of the stiffener 104 (see FIGS. 5A-5B). The end of the flexible sensor substrate 103 that is wrapped around the stiffener 104 may electrically couple to a flexible processor substrate, as illustrated and described in U.S. patent application Ser. No. 14/805,835. The stiffener 104 can be made of any suitable material, such as a metal, e.g., zinc or aluminum. In other arrangements, the stiffener 104 can be made of a plastic or ceramic. The stiffener 104 and the sensor substrate 103 can be disposed over a carrier 118 which is configured to support the processor substrate(s).

Further, a connector substrate 105 can extend from the outer surface of the electronic module 101. The connector substrate 105 can electrically couple the processor substrate (s) (not shown) to the external controller (such as the controller 14 of FIG. 2), which may be positioned away from the electronic module 101. The connector substrate 105 may also be made of a flexible material, such as a pigtail connector, and can include embedded metallic traces and conductive contacts configured to electrically connect to the processor substrate(s).

Figure 5A:
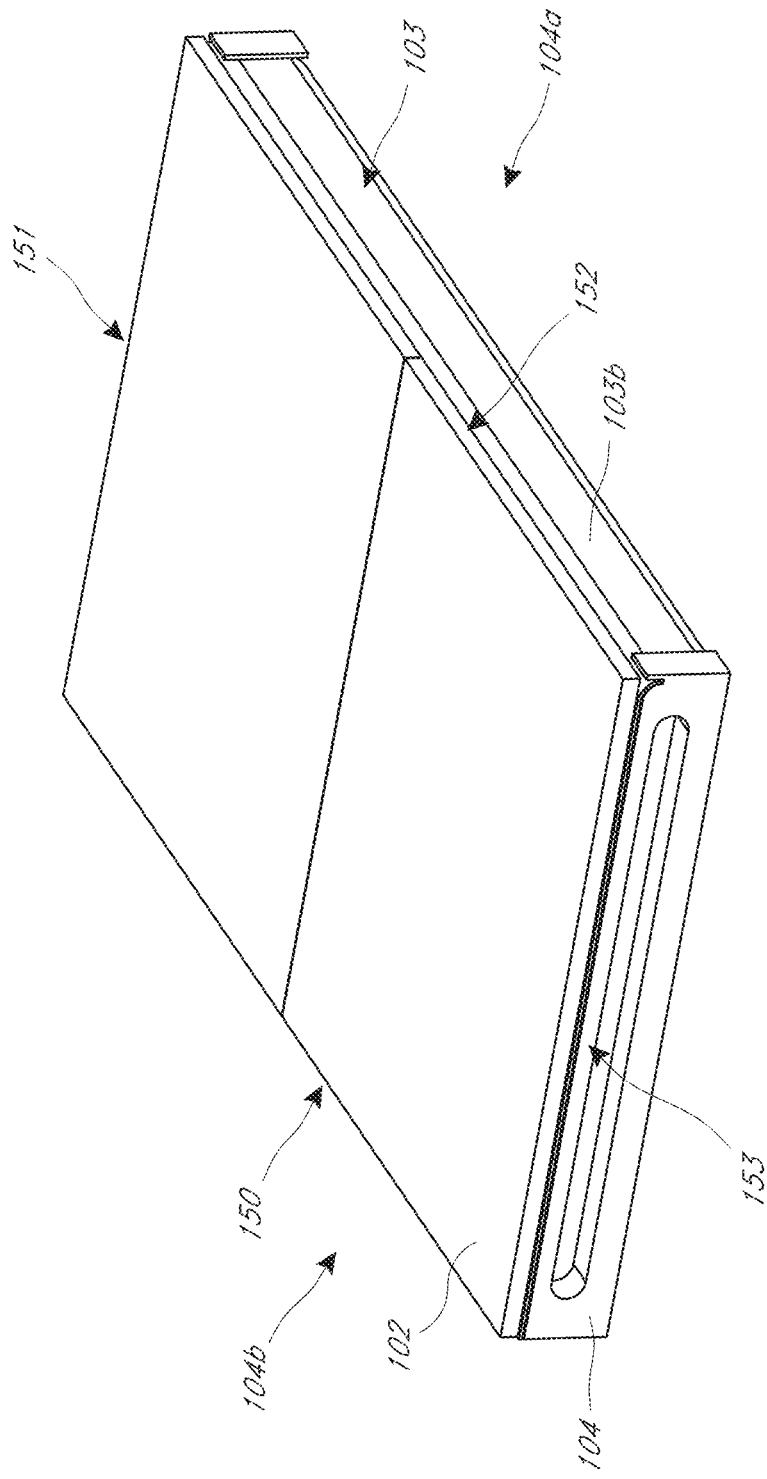
FIG. 5A is a schematic perspective view of a portion of the electronic module that illustrates sensor dies, a sensor substrate, and a stiffener, according to some embodiments.
Figure 5B:
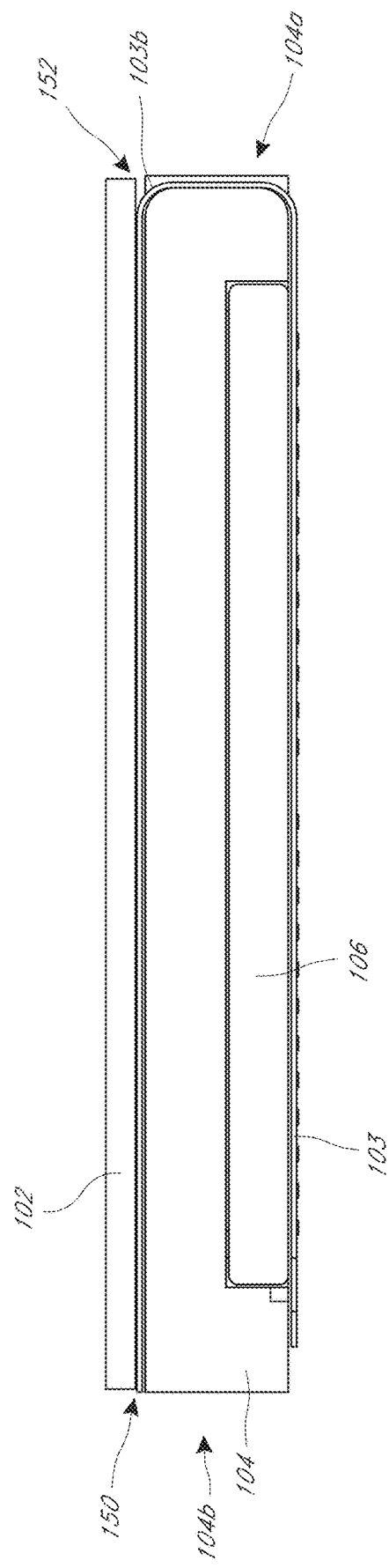
FIG. 5B is a side cross-sectional view of the portion of the electronic module shown in FIG. 5A.

FIG. 5A is a schematic perspective view of a portion of the electronic module 101 that illustrates the sensor dies 102, sensor substrate 103, and stiffener 104, according to some embodiments. FIG. 5B is a side cross-sectional view of the portion of the electronic module 101 shown in FIG. 5A. It can be important to provide a reliable electrical connection between the sensor dies 102 and the sensor substrate 103 while maintaining sufficiently small spacing between adjacent electronic modules 101, such as the adjacent modules 101 in a string 117 (see FIG. 3). In some embodiments, the sensor dies 102 can be soldered to the sensor substrate 103 using a plurality of solder balls (similar to the solder balls 16 of FIGS. 1B-1C) or other interconnects. An adhesive, similar to the adhesive 4 of FIGS. 1B-1C (e.g., an underfill epoxy) can be supplied between the sensor dies 102 and the sensor substrate 103, and can be flowed around the solder balls or interconnects to protect and enhance the reliability of the electrical connections between the dies 102 and the sensor substrate 103. In some arrangements, when the adhesive is flowed between the sensor dies 102 and the substrate 103, the adhesive or epoxy can squeeze out from the edges of the dies 102 and the substrate 103 and can creep upwardly along the sides of the dies 102. Such a positive adhesive edge fillet can extend outwardly relative to the outer perimeter of the electronic module 101. For example, the adhesive can protrude past the perimeter of the sensor dies 102 as seen from a top plan view of the module 101.

In some embodiments, the extension of a positive adhesive fillet beyond the outer perimeter of the electronic module 101 may be undesirable. For example, because surrounding electronic modules and other system components may be positioned adjacent a particular electronic module 101, it can be important to ensure that the positive adhesive fillet does not extend beyond the outer perimeter of the dies 102 or sensor substrate 103. In some arrangements, it can be desirable to ensure that the positive adhesive extends less than 50 microns outside the outer perimeter of the sensor die 102. If the positive epoxy fillet extends too far outside the perimeter of the die 102, then the end user may have difficulty assembling adjacent electronic modules or other components.

Accordingly, in some embodiments, epoxy underfill can be applied between the sensor dies 102 and the sensor substrate 103 such that a negative epoxy edge fillet is created at the edges of the dies 102, as explained above in connection with FIGS. 1A-1C. Such a negative fillet can be configured to not extend outside the outer perimeter of the sensor dies 102 (for example, as seen from a top or bottom plan view), which can ensure that adjacent electronic modules may be accurately and reliably placed next to one another. In some embodiments, it may be acceptable for a fillet to extend slightly past the outer perimeter, e.g., by less than 50 microns. For example, as shown in FIG. 5A, the sensor substrate 103 can be wrapped around the first side 104a of the stiffener 104 such that a bend 103b of the substrate 103 is positioned along the first side 104a. The electronic module 101 can include a first edge 152 disposed along the length of the first side 104a of the stiffener 104 and a second edge 150 disposed along the length of a second side 104b of the stiffener 104. As shown in FIGS. 5A and 5B, the first edge 152 can be disposed adjacent the bend 103b of the substrate 103. The electronic module 101 can also include opposing third and fourth edges 151, 153 along the width of the stiffener 104.

The sensor dies 102 can be connected to the sensor substrate 103 using a plurality of interconnects, such as solder balls, and the sensor substrate 103 can be wrapped around the stiffener 104. After wrapping the sensor substrate 103 around the stiffener 104, the underfill epoxy can be dispensed between the sensor dies 102 and the sensor substrate 103 along the second edge 150, e.g., along the edge that is opposite the bend 103b of the substrate 103. Capillary action can help draw the underfill epoxy around the solder balls (or other interconnects) and can pull the adhesive or epoxy to the first edge 152.

Figures 6A, 6B:
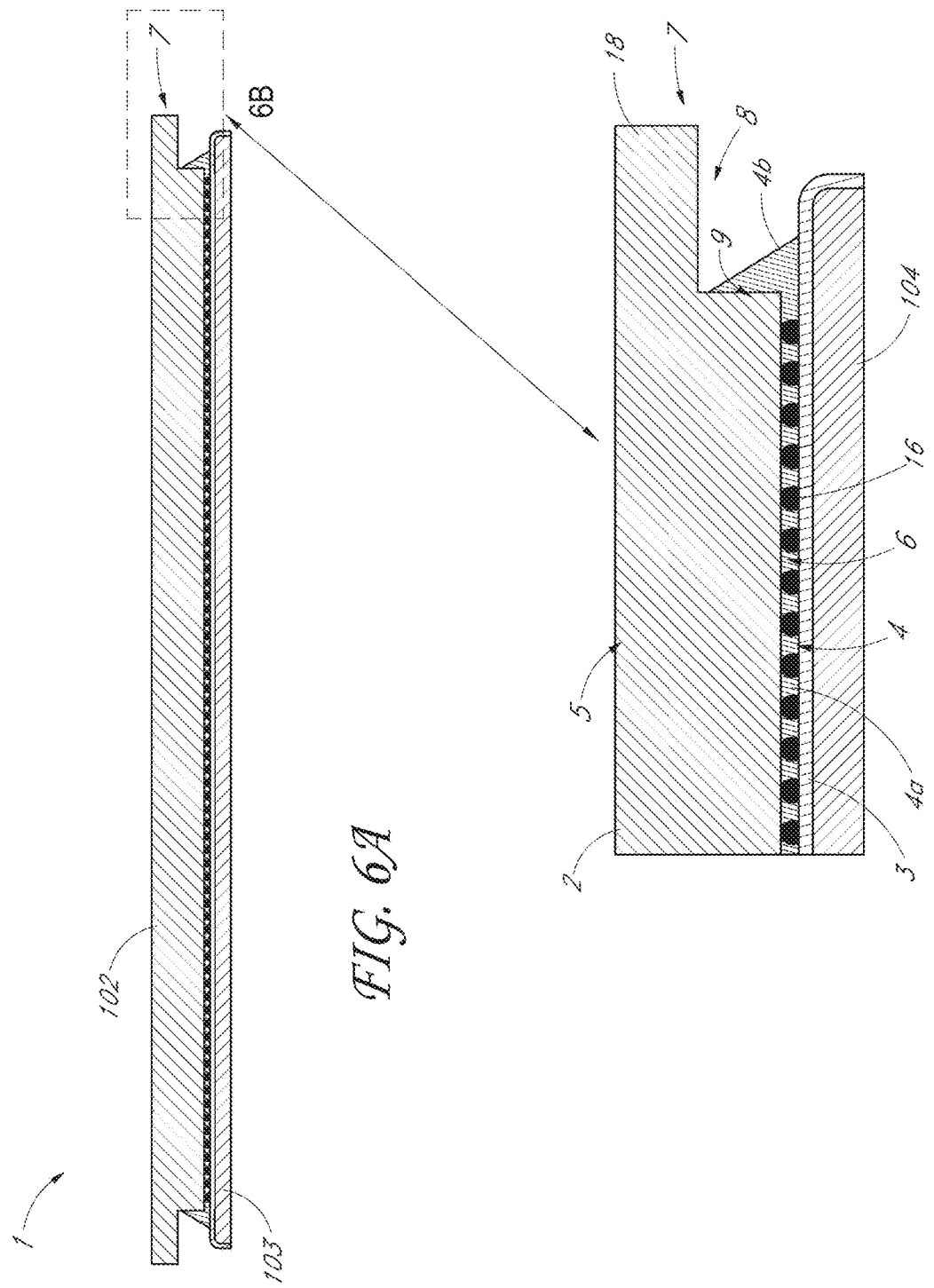
FIG. 6A is a schematic side view of a die mounted to a flexible substrate.
FIG. 6B is a schematic side view of the die and flexible substrate after bending the substrate around another supporting element.

FIG. 6A is a schematic side view of a module 1 that includes a die 102 mounted to a packaging substrate 103. As explained above, the substrate 103 may act as the carrier 3 shown in FIGS. 1A-1C. As shown in FIG. 6A, the substrate 103 may comprise a flexible substrate that is unfolded or flat prior to assembling a larger electronic module 101 shown, for example, in FIG. 4. Thus, prior to wrapping or folding, the substrate 103 may have a larger footprint than the footprint of the die(s) 102. After the wrapping or folding, the integrated device die 102 can be larger than or at least as wide as the substrate 103 laterally, in some embodiments. FIG. 6B is a schematic side view of the die 102 and substrate 103 after wrapping the substrate 103 around a supporting element in the form of a stiffener 104. As with the embodiments of FIGS. 1A-1C, the die 102 can comprise a first surface 8 recessed from the lower surface 6 of the die 2 and a second surface 9 between the first surface 8 and the lower surface 6, with the second surface 9 being laterally inset relative to the outer side edge 7. As with the embodiments of FIGS. 1A-1C, the first portion 4a of compound 4 (underfill in the illustrated embodiment) can be disposed between the lower surface 6 and the substrate 103 (e.g., a carrier), and can surround the solder balls 16. The second portion 4b of the compound 4 can be laterally inset relative to the outer side edge 7. Further, the ends of the stiffener 104 and a bend 103b can also be laterally inset relative to the outer side edge 7. By insetting the stiffener 104, the bend 103b of the substrate 103, and the compound 4 relative to the outer side edge 7, adjacent devices can be placed in close proximity to one another.

Figure 6C:
FIG. 6C is an image showing a side view of a die according to various embodiments.

Beneficially, in the embodiment of FIGS. 6A-6C, the die 102 can be attached to the substrate 103 by way of the compound 4 and solder balls 16 before incorporating the substrate 103 into a larger electronic module, such as by attaching the substrate 103 to (and wrapping the substrate 103 about) the stiffener 104. Thus, the die 102 and substrate can be inspected for voiding or for excessive compound that leaks beyond the edge 7 of the die 102 (positive fillets) before assembly, avoiding the greater expense of scrapping the assembled module. Moreover, handling the die 102 and substrate 103 assembly between solder attached and underfilling risks damage to the solder bonds before underfill reinforcement.

Figure 6D:
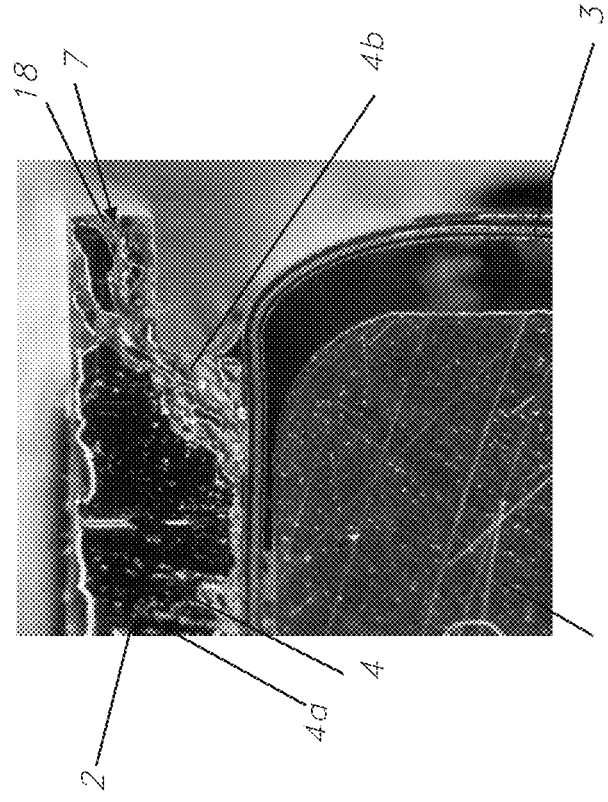
FIG. 6D is an image showing a side view of an integrated device die according to various embodiments.

FIG. 6C is an image showing a side view of an example die 102 mounted to a substrate 103. FIG. 6D is another image showing a side view of an integrated device die 2. As shown in FIG. 6D, for example, the second portion 4b of compound 4 can comprise a negative fillet entirely disposed within the outer periphery of the die 2, such that the compound is laterally inset relative to the outer side edge 7. The negative fillet defined by the second portion 4b can comprise a concave surface in some embodiments as shown in FIG. 6D. As it can be inferred from FIG. 6D, a shape and/or an amount of the second portion 4b may differ at different part of the die 2.

Figure 7A:
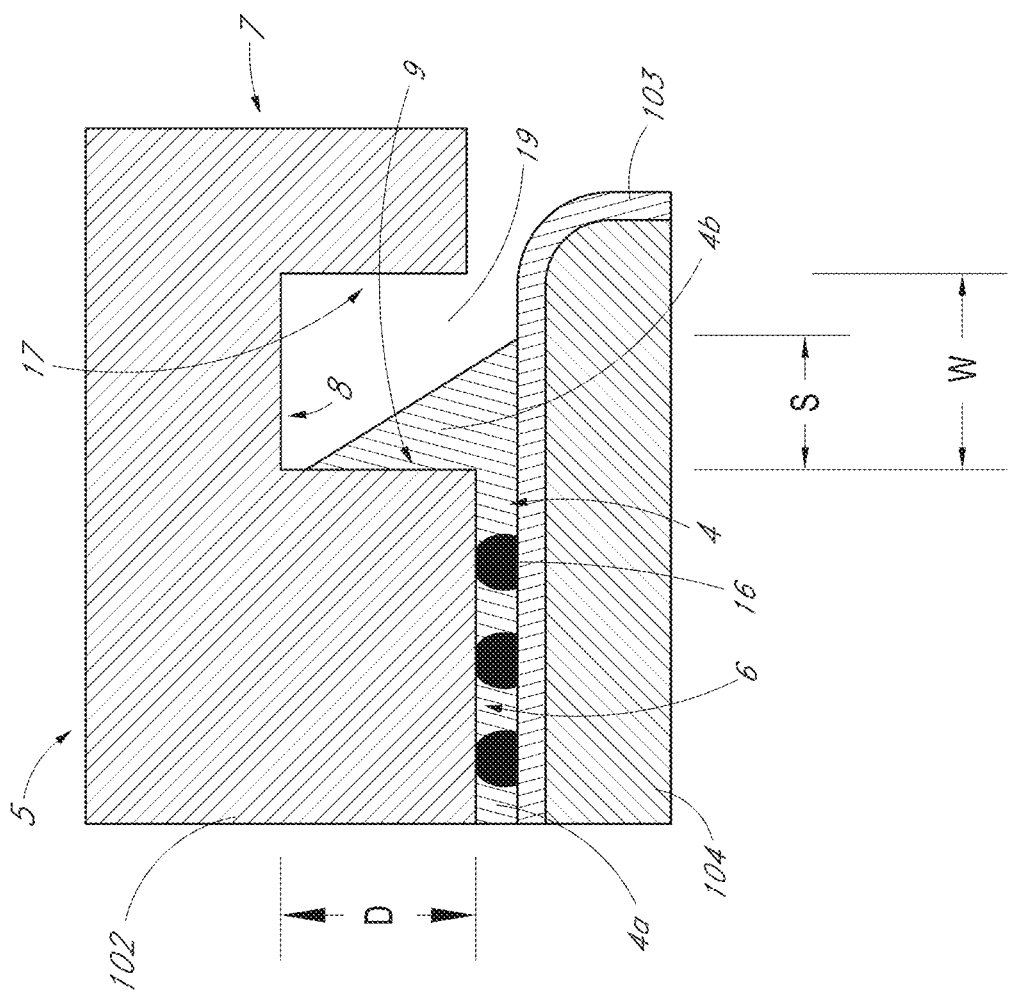
FIG. 7A is a schematic side view of a die and substrate after bending the substrate around a supporting element, according to another embodiment.

FIG. 7A is a schematic side view of a die 102 and substrate 103 after wrapping the substrate 103 around the stiffener 104, according to another embodiment. Unless otherwise noted, the components shown in FIG. 7A may be the same as or generally similar to like numbered components in FIGS. 1C and 6A-6D. For example, as with FIG. 1C, the groove 19 can be defined partially through a thickness of the die 102. A first portion 4a of the compound 4 can be disposed around solder balls 16 between the lower surface 6 of the die 102 (which may comprise a sensor die similar to the sensor die of FIGS. 5A-5B) and the carrier 103. A second portion 4b (e.g., a negative fillet) can be provided along at least a portion of the second surface 9 and can be laterally inset relative to the outer side edge 7 of the die 102. As with FIG. 1C, the groove 19 may reduce chipping and/or may maintain the structural integrity of the die 102 as compared with the embodiment of FIGS. 6A-6D.

Moreover, the groove 19 can have a width W and a depth D defined to accommodate the second portion 4b of the compound 4. In some embodiments, the depth D can be in a range of 100 microns to 300 microns, or in a range of 100 microns to 250 microns for a 500 micron thick die, e.g., in a range of 100 microns to 120 microns. In some embodiments, the depth D can be in a range of 20% to 50% of the thickness of the die 2, e.g., in a range of 20% to 30% of the thickness. A width W of the groove 19 may be greater than a fillet distance S representative of the width of the second portion 4b of the compound 4. In some embodiments, the width W of the groove 19 can be in a range of 100 microns to 500 microns.

Figure 7B:
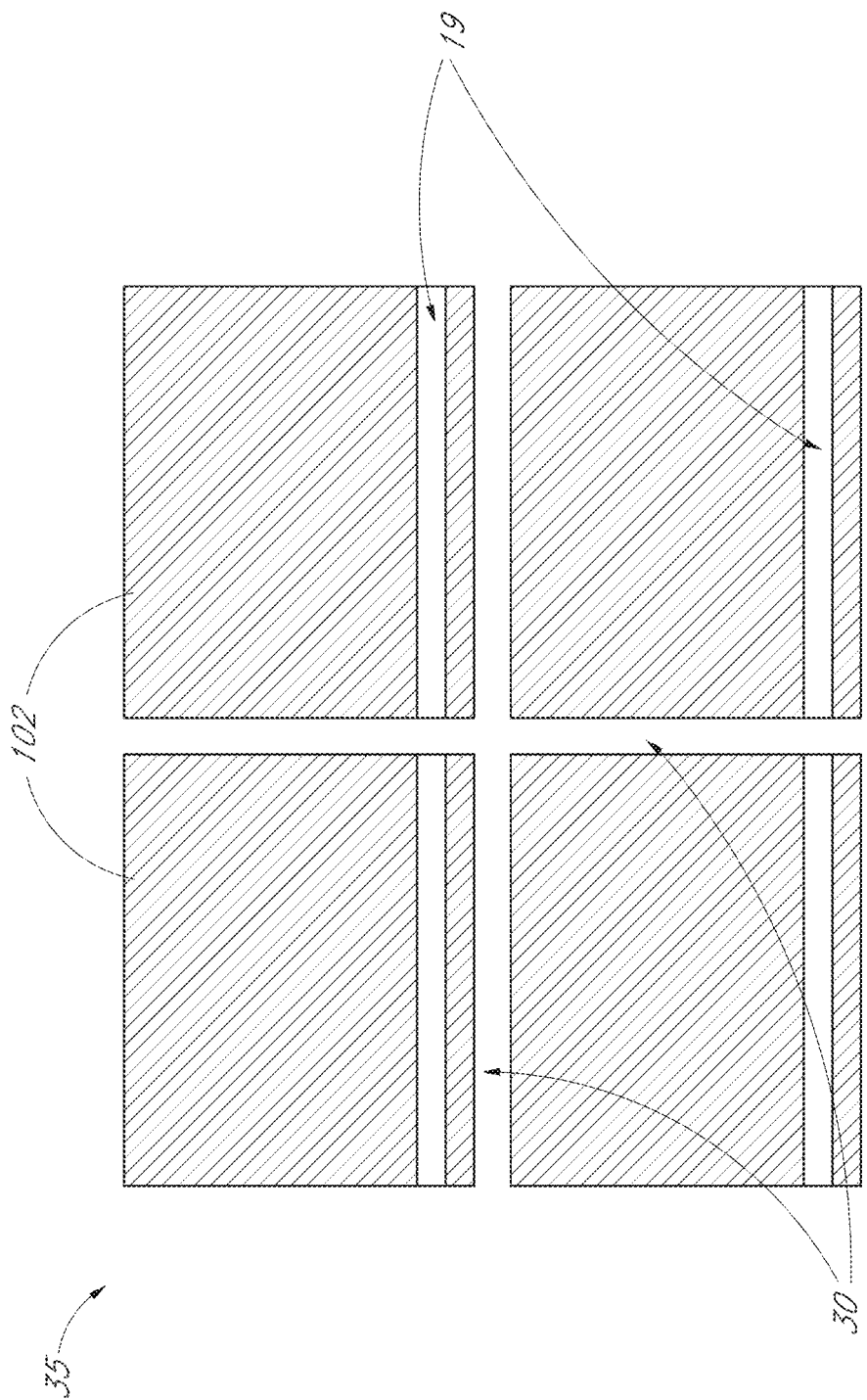
FIG. 7B is a bottom plan view of an array of dies after singulation from a wafer.

FIG. 7B is a bottom plan view of an array of dies 102 after singulation from a wafer 35. The dies 102 can be defined at the wafer level and subsequently singulated to define a plurality of singulated dies. Moreover, the groove 19 or slot can also be formed at the wafer level by making a plurality of partial saw cuts along an edge region of the dies 102 on a back side of the wafer 35 prior to singulation. Each die 102 of the pair may include only one groove at an end portion of the die 102, for embodiments in which two dies 102 are mounted together on a single carrier. The dies 102 can be singulated from the wafer 35 by sawing through the wafer along saw streets 30. In other embodiments, partial saw cuts can provide grooves 19 or step cuts (see FIG. 6B) along 1, 2, 3 or 4 edge regions of each die, depending upon which sides of the die are to be protected from the compound leaking out beyond the die edge during application in fluid form.

Figure 7C:
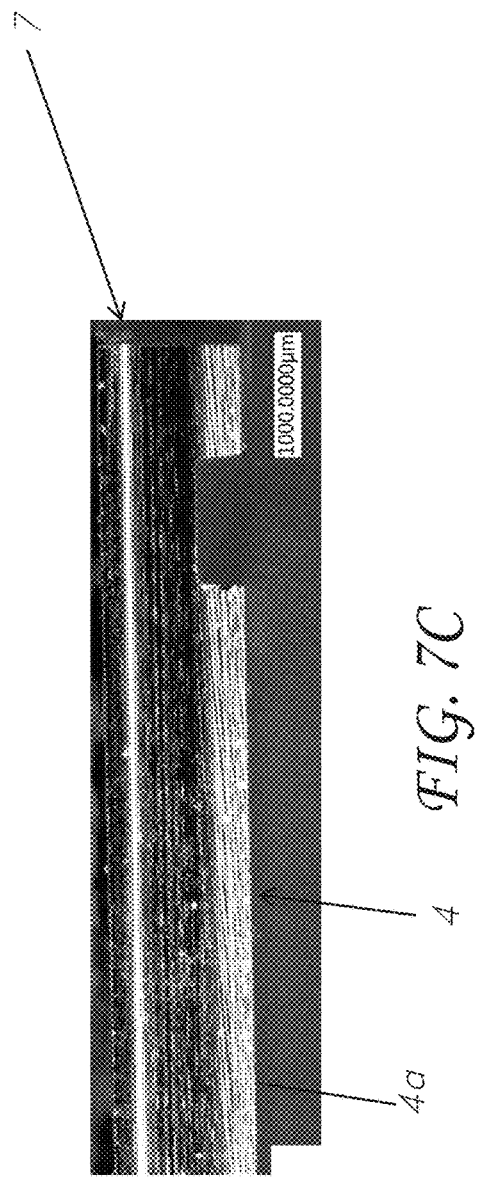
FIG. 7C is an image of a side view of an end portion of an example die.
Figure 7E:
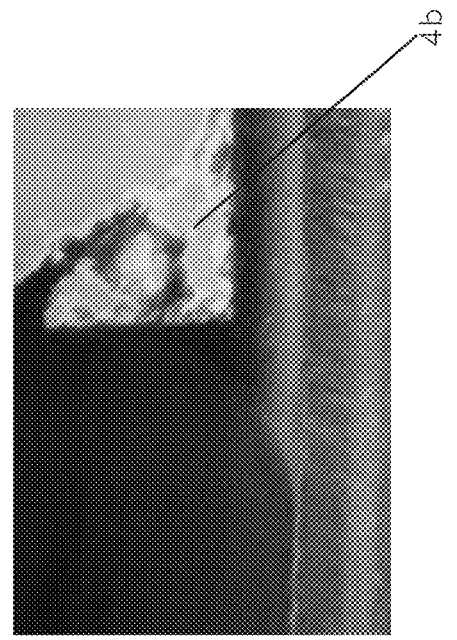
FIG. 7E is an image showing a second portion of the adhesive disposed in a groove.
Figure 7D:
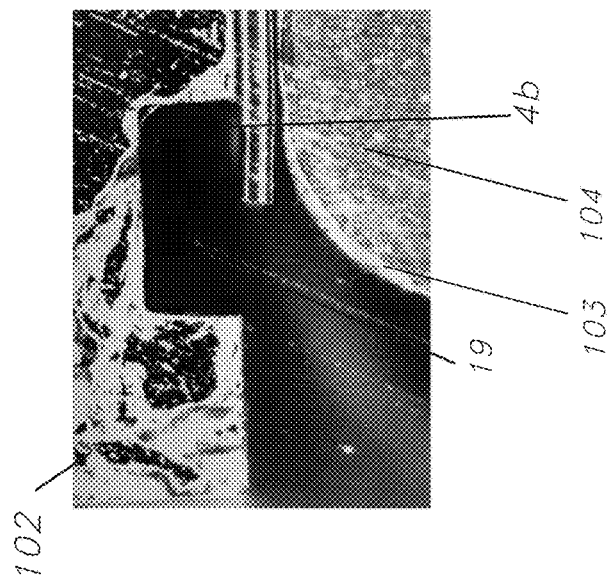
FIG. 7D is an image of a groove shown in an example die mounted on a substrate which is bent around a stiffener.

FIG. 7C is an image of a side view of an end portion of an example die 102. FIG. 7D is an image of a groove 19 shown in an example die 102. FIG. 7E is an image showing the second portion 4b of the compound 4 (e.g., the negative fillet) that is disposed in the groove 19. As explained above, the second portion 4b can beneficially be provided in the groove 19 and may not extend outwardly past the outer side edge 7 of the die 102.

Figure 8:
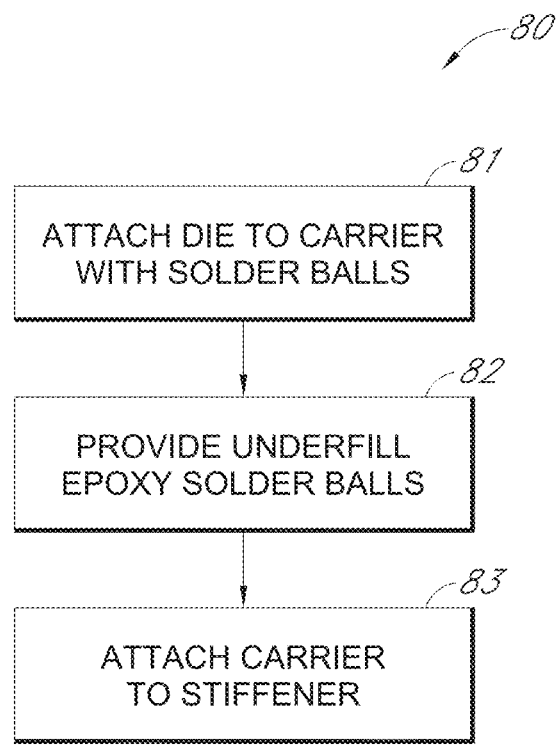
FIG. 8 is a flowchart illustrating a method for assembling an electronic module, according to various embodiments.

FIG. 8 is a flowchart illustrating a method 80 for assembling an electronic module, according to various embodiments. In a block 81, an integrated device die can be attached to a carrier with solder balls. For example, first contact pads on the lower surface of the integrated device die can be electrically connected to corresponding second contact pads on the carrier. In some embodiments, the carrier can comprise a flexible substrate comprising conductive traces embedded in a nonconductive material. The integrated device die can comprise any suitable type of die, such as a photosensitive die, e.g., an imaging sensor die. The integrated device die can have an upper surface, a lower surface, and an outer side edge. The integrated device die can have a first surface recessed from the lower surface and a second surface extending between the lower surface and the first surface. The second surface can be laterally inset from the outer side edge. In some embodiments, the first and second surfaces can define an overhang region of the die, such as the overhang region 18 shown in FIGS. 1B and 6A-6D. In other embodiments, a groove can be defined partially through the lower surface of the die. The first surface, the second surface, and a third surface can at least partially define the groove. The third surface can extend between the first surface and the lower surface. The first and third surfaces can be disposed on opposing sides of the groove.

Turning to a block 82, an underfill compound can be provided about the plurality of solder balls. As explained above, capillary action can draw the underfill adhesive between the die and carrier. A first portion of the compound can be disposed between the lower surface of the integrated device die and the carrier. A second portion of the compound can be disposed along at least a portion of the second surface of the integrated device die. In various embodiments, the compound does not contact the outer side edge of the integrated device die. The underfill compound can be cured to harden the compound by way of heating, exposure to radiation (e.g., ultraviolet radiation), or any other suitable curing method. The underfill fillet can be inspected to ensure adequate adhesion between the carrier and die, and to monitor the size and quality of the fillet.

Turning to a block 83, the carrier can be attached to a supporting element. In embodiments in which the carrier comprises a flexible substrate, the flexible substrate can be wrapped around a portion of a stiffener. Beneficially, in various embodiments, the integrated device die can be attached to the carrier, and the underfill can be provided and cured, before the carrier is attached to the stiffener and before wrapping. As explained above, providing the compound before attaching the carrier to the stiffener can improve the ability to inspect the underfill fillet. In other embodiments, however, the carrier may be attached to the stiffener prior to providing the compound.

FIG. 9 is a flowchart illustrating a method 90 for assembling an electronic module, according to another embodiment. In a block 91, an integrated device can be mounted to a carrier with a mounting compound. The integrated device die can have an upper surface, a lower surface, and an outer side edge. The integrated device die can comprise a first surface recessed from the lower surface and a second surface extending between the lower surface and the first surface. The second surface can be laterally inset from the outer side edge. The mounting compound can comprise a first portion disposed between the lower surface of the integrated device die and the carrier. A second portion of the mounting compound can be disposed along at least a portion of the second surface of the integrated device die. In some embodiments, as explained above, the die can be physically and electrically connected to the carrier with a plurality of solder balls, and the mounting compound can comprise an underfill epoxy that is flowed around the solder balls and cured. In other embodiments, the mounting compound can comprise a die attach material or adhesive, and the die can be wire bonded to the carrier. In various embodiments, the mounting compound can comprise ACF or NCP.

Although this invention has been disclosed in the context of certain embodiments and examples, it will be understood by those skilled in the art that the present invention extends beyond the specifically disclosed embodiments to other alternative embodiments and/or uses of the invention and obvious modifications and equivalents thereof. In addition, while several variations of the invention have been shown and described in detail, other modifications, which are within the scope of this invention, will be readily apparent to those of skill in the art based upon this disclosure. It is also contemplated that various combinations or sub-combinations of the specific features and aspects of the embodiments may be made and still fall within the scope of the invention. It should be understood that various features and aspects of the disclosed embodiments can be combined with, or substituted for, one another in order to form varying modes of the disclosed invention. Thus, it is intended that the scope of the present invention herein disclosed should not be limited by the particular disclosed embodiments described above, but should be determined only by a fair reading of the claims that follow.

What is claimed is:

1. An electronic module comprising:
a package substrate disposed on a stiffener;
an integrated device die having an upper side, a lower side, and an outer side edge, the lower side comprising a first portion and a recess at or near the outer side edge, wherein the integrated device die is at least as wide as the stiffener laterally; and
a mounting compound comprising a first portion disposed between the first portion of the integrated device die and the package substrate and a second portion disposed along at least a portion of the recess of the integrated device die, the mounting compound laterally inset relative to the outer side edge of the integrated device die.

2. The electronic module of claim 1, further comprising a plurality of electrical interconnects electrically connecting first contact pads on the first portion of the integrated device die with corresponding second contact pads on the package substrate, the mounting compound comprising an underfill material disposed around the plurality of electrical interconnects.

3. The electronic module of claim 1, further comprising active circuitry at or near the lower side of the integrated device die or at or near the upper side of the integrated device die.

4. The electronic module of claim 1, wherein the recess of the integrated device die has a depth from the first portion of the integrated device die, the depth is in a range from 20% to 50% of a thickness of the integrated device die.

5. The electronic module of claim 1, wherein the mounting compound comprises a concave surface.

6. The electronic module of claim 1, wherein the package substrate comprises a flexible substrate including a nonconductive material with embedded metal traces, and the flexible substrate wrapped around a portion of the stiffener.

7. The electronic module of claim 1, wherein the integrated device die comprises a sensor die.

8. The electronic module of claim 1, wherein the recess is laterally inset from the outer side edge in a range of 100 microns to 500 microns.

9. The electronic module of claim 1, wherein the recess comprises a sloped wall extending between the first portion of the integrated device die and the outer side edge.

10. The electronic module of claim 1, wherein the recess comprises a groove having a first wall extending vertically from the first portion of the integrated device die towards the upper surface and a second wall, the first and second walls disposed on opposing sides of the groove.

11. An electronic module comprising:
a package substrate having a mounting portion and a bent portion that is bent relative to the mounting portion about a support structure;
an integrated device die having an upper surface, a lower surface, and an outer side edge, the lower surface comprising a mounting surface and a groove being inset from the outer side edge, the bent portion of the package substrate being inset from the outer side edge; and a mounting compound disposed between the mounting surface of the integrated device die and the mounting portion of the package substrate, the mounting compound being laterally inset from the outer side edge.

12. The electronic module of claim 11, wherein a portion of the mounting compound disposed in the groove of the integrated device die.

13. The electronic module of claim 11, wherein the integrated device comprises a first portion having a first average thickness, a second portion having a second average thickness thinner than the first average thickness, and a third portion hanging from the second portion, wherein the groove is formed between the first portion and the third portion.

14. The electronic module of claim 11, wherein the groove partially surrounds the mounting surface of the lower surface.

15. The electronic module of claim 11, further comprising a conductive wire electrically connecting a first contact pad on the upper surface of the integrated device die with a second contact pad on the package substrate.

16. The electronic module of claim 11, further comprising a plurality of solder balls electrically connecting first contact pads on the lower surface of the integrated device die with corresponding second contact pads on the package substrate, the mounting compound comprising an underfill material disposed around the plurality of solder balls.

17. The electronic module of claim 11, further comprising active circuitry at or near the lower surface of the integrated device die.

18. The electronic module of claim 11, wherein the mounting compound is laterally inset relative to the outer side edge of the integrated device die.

19. An electronic module comprising:
means for mounting an integrated device die on a package substrate disposed on a stiffener,
wherein the integrated device die has an upper side, a lower side, and an outer side edge, the lower side comprising a first portion and means for receiving the mounting means at or near the outer side edge, wherein the integrated device die is at least as wide as the stiffener laterally, and
wherein the mounting means comprises a first portion disposed between the first portion of the integrated device die and the package substrate and a second portion disposed along at least a portion of the means for receiving the means for mounting, the means for mounting does not extend outside of the outer side edge.

20. The electronic module of claim 19, wherein the mounting means comprises an underfill material and the receiving means comprises a recess that prevents the mounting means from moving to the upper side of the integrated device die.

* * * * *